(12) United States Patent
Hirabayashi

(10) Patent No.: US 10,502,369 B2
(45) Date of Patent: Dec. 10, 2019

(54) CIRCUIT BOARD AND IMAGE FORMING APPARATUS

(71) Applicant: CANON KABUSHIKI KAISHA, Tokyo (JP)

(72) Inventor: Jun Hirabayashi, Kawasaki (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 15/631,234

(22) Filed: Jun. 23, 2017

(65) Prior Publication Data

US 2018/0010739 A1    Jan. 11, 2018

(30) Foreign Application Priority Data

Jul. 11, 2016  (JP) .................. 2016-136820

(51) Int. Cl.
| | | |
|---|---|---|
| H01L 33/00 | (2010.01) | |
| F21K 9/238 | (2016.01) | |
| H05K 1/18 | (2006.01) | |
| H01L 33/60 | (2010.01) | |
| H01L 33/48 | (2010.01) | |
| H05K 1/02 | (2006.01) | |
| H05K 3/00 | (2006.01) | |

(52) U.S. Cl.
CPC ............ *F21K 9/238* (2016.08); *H01L 33/486* (2013.01); *H01L 33/60* (2013.01); *H05K 1/0274* (2013.01); *H05K 1/181* (2013.01); *H05K 3/0064* (2013.01); *H05K 2201/049* (2013.01); *H05K 2201/09063* (2013.01); *H05K 2201/10106* (2013.01)

(58) Field of Classification Search
CPC .............................. H01L 33/486; H01L 33/60
See application file for complete search history.

(56) References Cited

U.S. PATENT DOCUMENTS

| | | | |
|---|---|---|---|
| 8,843,032 B2 | 9/2014 | Kubo | |
| 9,306,466 B2 | 4/2016 | Hirabayshi | |
| 9,343,985 B2 | 5/2016 | Hirabayshi | |
| 2010/0206628 A1* | 8/2010 | Matsui | ..................... H01J 11/10 |
| | | | 174/389 |
| 2010/0237772 A1* | 9/2010 | Sakai | ......................... B41J 2/45 |
| | | | 313/504 |
| 2016/0238983 A1 | 8/2016 | Hirabayashi | |

FOREIGN PATENT DOCUMENTS

JP    2012-163601 A    8/2012

OTHER PUBLICATIONS

U.S. Appl. No. 15/614,867, filed Jun. 6, 2017. Applicant: Jun Hirabayshi.

* cited by examiner

*Primary Examiner* — Samuel A Gebremariam
(74) *Attorney, Agent, or Firm* — Venable LLP

(57) ABSTRACT

The circuit board has a surface mount LED with a lens on the circuit board. A conductive portion and remaining space in the periphery of the LED are covered with solid copper foil so that reflectance of light and a heat dissipation effect are enhanced. In addition, layer structures between the circuit board and an assembled component are the same between contact portions with the assembled component so that tilt in mounting the board is suppressed. As a result, the circuit board having mounted thereon the surface mount LED having high directivity can be accurately mounted on the assembled component, tilt of an optical axis can be suppressed, the reflectance of light from the LED can be increased, and the heat dissipation effect can be enhanced.

27 Claims, 3 Drawing Sheets

CIRCUIT BOARD AND IMAGE FORMING APPARATUS

BACKGROUND OF THE INVENTION

Field of the Invention

The present invention relates to assembly accuracy of a circuit board having mounted thereon a surface mount light emitting element having strong directivity in a predetermined direction.

Description of the Related Art

Nowadays, light emitting diodes (hereinafter referred to as "LED") are popular as compact and inexpensive light sources, and many products use the light emitting diodes not only for indicators but also for illumination and functional parts. The light emitting diodes are used for LED tube lights, backlight of liquid crystal displays, light for illumination of originals on image reading apparatus including scanners, and discharge lamps (hereinafter referred to as "pre-exposing device") in image forming apparatus, for example. The pre-exposing device is a device configured to lower the surface potential of a photosensitive drum and emit light to the photosensitive drum to achieve uniform potential distribution, after transfer of a toner image is complete in an image forming unit of an image forming apparatus, for example, a laser printer. An exemplary method of emitting light to the photosensitive drum that is applied to the pre-exposing device is described in Japanese Patent Application Laid-Open No. 2012-163601, for example. In Japanese Patent Application Laid-Open No. 2012-163601, a light guide is installed in parallel to a longitudinal direction of a photosensitive drum. Light is projected from an LED to the light guide from one end of the light guide, and is reflected by grooves in the light guide. In this way, the light is uniformly emitted to the photosensitive drum in the longitudinal direction.

Meanwhile, LEDs themselves have been increased in luminous intensity and decreased in cost, and a trend of the kinds of LEDs to be used has been changing. For example, in addition to indication use and light source use, lead LEDs having a bullet shape have hitherto been mainstream LEDs. The bullet-shaped LEDs have a feature of having strong directivity in a predetermined direction. The bullet-shaped LED includes, in its bullet part, a clear mold functioning as a lens to converge light from an LED chip, and thus achieves strong directivity and accordingly high luminous intensity. However, a long time has lapsed since the bullet-shaped LEDs were developed. In recent years, surface mount LEDs having strong directivity called "chip LED with reflecting mirror" or "chip LED with lens", which have been developed with aims to further reduce cost and space, have emerged. Related-art surface mount LEDs (hereinafter referred to as "chip LED"), which have weak directivity and low luminous intensity in many cases, have been used mainly for indication. In contrast, the chip LEDs with reflecting mirrors and the chip LEDs with lenses described above use an element having higher light emission efficiency than the related-art products, and the reflecting mirrors or the lenses converge light from the LEDs, with the result that such chip LEDs achieve high luminous intensity. The directivity of the bullet-shaped LEDs has been completely different from that of the chip LEDs, but chip LEDs having directivity similar to that of the bullet-shaped LEDs have been developed recently. Specifically, the directivity half value angle (an inner angle in a direction in which luminous intensity is relatively 50% of luminous intensity in the central axis) of narrow angle bullet-shaped LEDs is about ±10°, whereas the directivity half value angle of the related-art chip LEDs is from ±80° to ±100° or more. Meanwhile, there are chip LEDs with reflecting mirrors whose directivity half value angle is about ±60°, and chip LEDs with lenses whose directivity half value angle is even ±10° or less. Further, the chip LEDs are smaller than the bullet-shaped LEDs in size of LEDs alone, and are capable of being manufactured at a lower cost. Market demand has been changing accordingly from the bullet-shaped LEDs to the chip LEDs.

However, when the bullet-shaped LED used in the pre-exposing device of the type using the light guide described above is replaced with a chip LED, the following some problems arise. In the case of the light guide type, in order to allow light to travel from the entrance to the light guide to reach an end portion on the opposite side (hereinafter referred to as "farthest portion") of the light guide, it is necessary to use an LED having high luminous intensity on an optical axis, that is, an LED having strong directivity. However, when light having strong directivity enters the entrance to the light guide with an optical axis that is tilted even slightly, a light amount is lowered at the farthest portion of the light guide, leading to a dark portion. Further, the pattern of repetitive reflection inside the light guide varies, and a luminous intensity distribution thus varies over the whole area of the photosensitive drum in the longitudinal direction, resulting in unevenness of the light. In order to solve this problem, in the related-art bullet-shaped LED, the angle of the LED is fixed by pressing the bullet part by a mold component or lightly press fitting the bullet part into a hole formed in the mold component so that the angle of the optical axis may not change. However, the chip LED is mounted on a board by soldering, and hence there is a risk in that solder crack, peeling of plating of an electrode, and other defects may occur by application of external force. Because of this, the chip LED cannot use a technique of holding the contour portion by a mold component or lightly press fitting the contour portion into a hole formed in the mold component, which is used in the bullet-shaped LED. Accordingly, when a chip LED is used in a pre-exposing device of the light guide type, it is necessary that not the chip LED alone but the chip LED and a board having the chip LED mounted thereon be accurately mounted on a mold component.

However, the type in which a board is mounted on a mold component has the following three problems unlike the type in which a bullet-shaped LED is lightly press fitted into a mold component. The first problem is a problem related to assembly accuracy. A chip LED is mounted on the surface of a board on which an electro conductive pattern is drawn or silk screen printing for providing marks is performed. When the electro conductive pattern or the silk screen printed portion is present at a contact portion between the board and the mold component, and the mold component is mounted on a portion including the electro conductive pattern or the silk screen printed portion, the board is slightly tilted with respect to the mold component. The thicknesses of the electro conductive pattern and the silk screen printed portion cause no trouble in normal use. However, in the case of the pre-exposing device of the light guide type, the slight tilt of the board leads to a large shift of an optical axis at the farthest portion. It is thus necessary to eliminate the difference in height. When the board is sufficiently large, the difference in height can be prevented by devising the arrangement of the electro conductive pattern and the silk screen printed portion. However, when the board itself is small, it is difficult to arrange the electro conductive pattern and the silk screen printed portion while avoiding the contact portion with the mold component.

The second problem is that light from the chip LED leaks to the periphery of the chip LED by a large amount. The bullet-shaped LED is lightly press fitted into the mold component, and hence the periphery of the clear mold is surrounded by the cylindrical mold component due to the press fitting. The cylindrical mold component functions like a reflecting mirror, and light leaking from the bullet-shaped LED in a direction of 60° with respect to the optical axis, for example, is emitted in an optical axis direction while being reflected in the cylinder described above. However, the amount of light leaking from the chip LED is large for structural reasons as compared to the bullet-shaped LED. In addition, due to a fear of application of external force by the mold component being brought into contact with the board, a cylindrical mold component and other components cannot be arranged in proximity to the chip LED itself, which is mounted on the board. Consequently, the ratio of the light amount of the light emitted from the chip of the LED itself in the optical axis direction is low as compared to the bullet-shaped LED.

The third problem is a problem related to heat dissipation. LEDs are heat generating components. In using LEDs having large output, it is necessary to consider heat dissipation. The bullet-shaped LED is a lead component, and can transfer heat to other members through a lead having high heat conductivity. In contrast, the chip LED is mounted on the board having low heat conductivity, and cannot transfer heat to other members.

SUMMARY OF THE INVENTION

The present invention achieves highly accurate assembly of a circuit board having a light emitting element mounted thereon to a mold component, increased reflectance of light from the light emitting element in an optical axis direction, and an increased heat dissipation effect of the light emitting element.

In order to solve the above-mentioned problems, according to one embodiment of the present invention, there is provided a circuit board on which a light emitting element is mounted, including a first contact portion and a second contact portion that are brought into contact with an assembled member to which the circuit board is assembled, the light emitting element being arranged between the first contact portion and the second contact portion, and a first electro conductive pattern and a second electro conductive pattern that are provided in a first region of the first contact portion and a second region of the second contact portion, respectively, the first region and the second region being brought into contact with the assembled member.

Also, there is provided an image forming apparatus including an image bearing member, a light emitting element configured to emit light to the image bearing member, a circuit on which the light emitting element is mounted, and an assembled member for assembling the circuit board, the circuit board including a first contact portion and a second contact portion that are brought into contact with the assembled member to which the circuit board is assembled, the light emitting element being arranged between the first contact portion and the second contact portion, and a first electro conductive pattern and a second electro conductive pattern that are provided on a first region of the first contact portion and a second region of the second contact portion, respectively, the first region and the second region being brought into contact with the assembled member.

Further features of the present invention will become apparent from the following description of exemplary embodiments with reference to the attached drawings.

DESCRIPTION OF THE EMBODIMENTS

Embodiments of the present invention are described in detail with reference to the drawings.

A first embodiment of the present invention is described.

[Structure of Image Forming Apparatus]

Figure 1:
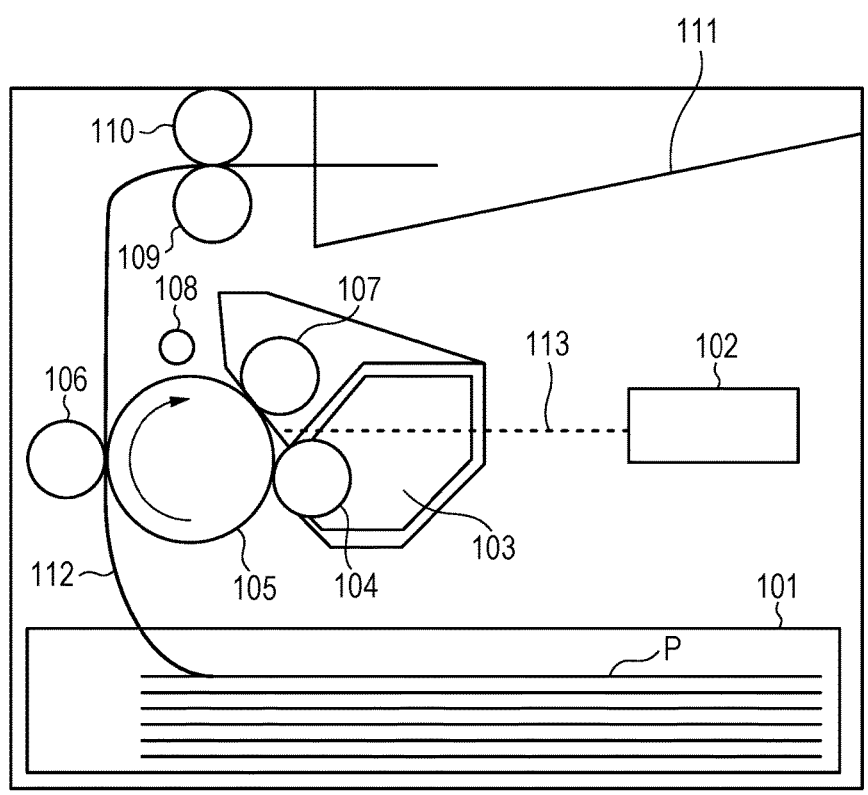
FIG. 1 is a sectional view for illustrating the schematic structure of an image forming apparatus according to first and second embodiments of the present invention.

FIG. 1 is a sectional view for illustrating the schematic structure of a monochrome laser printer being an image forming apparatus to which a pre-exposing device of the first embodiment is applied. In FIG. 1, a sheet feeding unit 101 stores therein sheets P being recording materials, and feeds the sheet P to an image forming unit through a conveyance path 112 in printing. The image forming unit configured to form an image on the sheet P fed from the sheet feeding unit 101 includes a laser scanner 102, a toner tank 103, a developing roller 104, a photosensitive drum 105, a transfer roller 106, a charge roller 107, and a light guide 108 of the pre-exposing device. A fixing device configured to fix, onto the sheet P, a toner image transferred onto the sheet P by the image forming unit includes a fixing roller 109 and a pressure roller 110, and the sheet P that has passed through the fixing device is discharged to a sheet discharge unit 111. A laser light path 113 (broken line in FIG. 1) represents the optical path of laser light emitted from the laser scanner 102. Further, the toner tank 103 stores magnetic toner.

The light guide 108 is arranged in parallel to a longitudinal direction of the photosensitive drum 105 (front-to-rear direction in FIG. 1). The light guide 108 receives light projected from an LED 204 of the pre-exposing device, which is described later, from the light entrance portion of the light guide 108 (see FIGS. 2A, 2B and 2C). The light guide 108 is configured to reflect, by grooves formed therein, the light projected from the LED 204 of the pre-exposing device, which is described later, from the light entrance portion to the farthest portion little by little so that the light may be uniformly emitted from the LED 204 to the whole area of the photosensitive drum 105 in the longitudinal direction.

[Operation of Image Forming Apparatus]

Next, the operation of the image forming apparatus is described. First, when the image forming apparatus receives a print job including image data on an image to be formed from an external device, for example, a personal computer, the image forming apparatus starts the operation of the various rollers, the photosensitive drum 105, and the laser scanner 102 described above. The charge roller 107 is supplied with negative high voltage from a power supply (not shown) to charge the surface of the photosensitive drum 105 at a uniform potential. The laser scanner 102 emits laser light depending on an image signal based on the image data that the image forming apparatus receives from the external device to scan the surface of the photosensitive drum 105. The laser light is emitted to the photosensitive drum 105 through the laser light path 113. The charges disappear from the laser-light-emitted portion of the surface of the photosensitive drum 105, and an electrostatic latent image is thus formed. The developing roller 104 accommodates a magnet, and attracts the magnetic toner stored in the toner tank 103 by magnetic force. In addition, when being supplied with negative high voltage, the developing roller 104 moves, by electrostatic force, the toner to the photosensitive drum 105 depending on the potential of the electrostatic latent image formed on the photosensitive drum 105 to develop the electrostatic latent image with the toner, thereby forming a toner image. Meanwhile, the sheet P fed from the sheet feeding unit 101 is conveyed on the conveyance path 112 to reach a nip portion formed by the transfer roller 106 and the photosensitive drum 105 being in abutment against each other. At this time, the transfer roller 106 is supplied with positive high voltage, and the toner forming the toner image on the photosensitive drum 105 is attracted to the transfer roller 106. As a result, the toner image on the photosensitive drum 105 is transferred onto the sheet P. Then, the sheet P having the toner image transferred thereonto is conveyed to the fixing device to reach a nip portion formed by the fixing roller 109 and the pressure roller 110 being in abutment against each other. In the fixing device, the conveyed sheet P is heated by the fixing roller 109 at several hundred degrees Celsius, and is pressurized by the pressure roller 110 so that the toner image is fixed onto the sheet P. Then, the sheet P is conveyed from the fixing device to be discharged to the sheet discharge unit 111. The surface potential of the photosensitive drum 105 after the transfer of the toner image onto the sheet P is complete is uneven due to the image. Thus, the pre-exposing device discharges the surface potential of the photosensitive drum 105 to a uniform value, namely, around 0 V using the light guide 108 so that the unevenness may not affect an electrostatic latent image that is formed next on the photosensitive drum 105. The image forming apparatus performs the processing of the print job while repeating the image forming operation described above.

[Structure of Pre-Exposing Device]

Figure 2A:
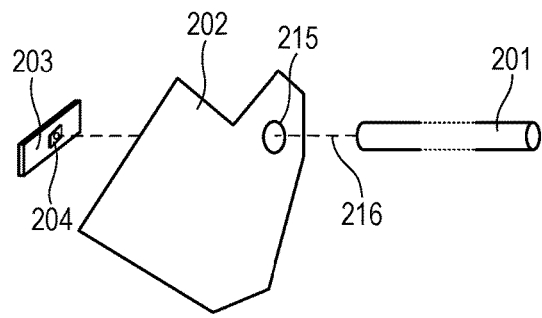
FIG. 2A is the structure of a pre-exposing device of the first and second embodiments.

FIG. 2A is a schematic view for illustrating the device structure of the pre-exposing device of FIG. 1. The pre-exposing device includes a circuit board 203 having mounted thereon a chip LED 204 with a lens for the pre-exposing device (hereinafter referred to as "LED 204"), a mold component 202 being an assembled member to which the circuit board 203 is assembled, and a light guide 201. In FIG. 2A, a hole 215 is a hole through which the light emitted from the LED 204 passes, and a center line 216 represents the center line of the light guide 201. The light guide 201 illustrated in FIG. 2A represents the light guide 108 of FIG. 1 when seen in the longitudinal direction. In FIG. 2A, the light guide 201, the mold component 202, and the circuit board 203 are spaced apart from each other for description. In an actual image forming apparatus, however, the circuit board 203 is assembled to the mold component 202, and the light guide 201 is arranged at a location away from the mold component 202 by about several millimeters.

As a distance from the LED 204 to the entrance to the light guide 201 increases, the light from the LED 204 is scattered by a larger amount. As a result, the amount of light that is irregularly reflected inside the light guide 201 decreases, leading to a decrease in amount of light at the farthest portion of the light guide 201. Accordingly, the distance from the LED 204 to the entrance to the light guide 201 is short. The LED 204 is a surface mount light emitting diode having strong directivity in a predetermined direction. The first embodiment uses a light emitting diode having a directivity half value angle of ±15° or less, which represents directivity.

[Structure of Circuit Board of Pre-Exposing Device of Related Art]

Figure 2B:
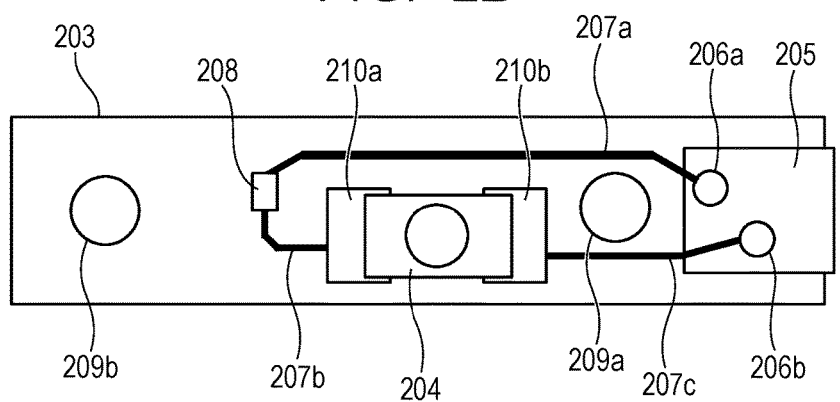
FIG. 2B is the structure of a circuit board of a pre-exposing device of the related art.
Figure 2C:
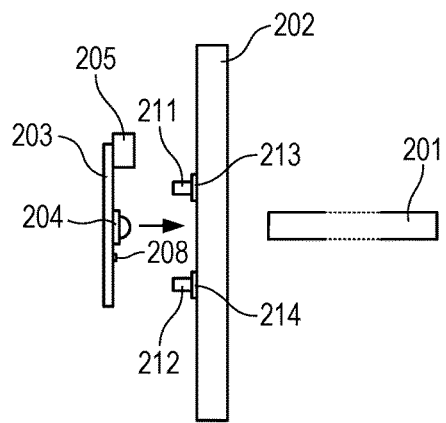
FIG. 2C is a view for illustrating assembly of the pre-exposing device.

Next, for comparison with the circuit board of the first embodiment, which is described later, the structure of a circuit board 203 of a pre-exposing device of the related art is described. FIG. 2B is an enlarged view of the circuit board 203 of the pre-exposing device of the related art, and is a view of the surface of the circuit board 203 on which the LED 204 is mounted when seen from the mold component 202 side. Further, FIG. 2C is a view of the view of FIG. 2A when seen from the upper direction of FIG. 2A. In FIG. 2B and FIG. 2C, a connector 205 is a connector for supplying current to the circuit on the circuit board 203, and lands 206a and 206b are lands of the terminal of the connector 205. Further, an electro conductive pattern 207a is an electro conductive pattern provided between the land 206a and a chip resistor 208, an electro conductive pattern 207b is an electro conductive pattern provided between the chip resistor 208 and a land 210a, and an electro conductive pattern 207c is an electro conductive pattern provided between a land 210b and the land 206b. Holes 209a and 209b are holes passing through the circuit board 203, for fixing the circuit board 203 of the pre-exposing device to the mold component 202. The lands 210a and 210b are lands for mounting the LED 204 on the circuit board 203.

[Method of Assembling Circuit Board to Mold Component of Related Art]

Further, in order to prevent the connector 205, the LED 204, and the chip resistor 208 from being brought into contact with the mold component 202 when the circuit board 203 of the pre-exposing device is assembled to the mold component 202, the mold component 202 has the hole 215 and holes (not shown) at locations opposed to those components. With the holes, when the circuit board 203 of the pre-exposing device is pressed against the mold component 202 in a direction of the arrow as illustrated in FIG. 2C, the connector 205 and the chip resistor 208 are buried in the holes (not shown) in the mold component 202. Further, the LED 204 is buried in the hole 215 of FIG. 2A. As a result, the circuit board 203 is arranged in parallel to the mold component 202. Then, the circuit board 203 of the pre-exposing device is pressed against the mold component 202 with a spring, a claw member, or other members from the back surface side of the circuit board 203, thereby being fixed to the mold component 202. Further, the mold component 202 has a rib 211 and a rib 212 being projected protruding portions opposed to the holes 209a and 209b of the circuit board 203 of the pre-exposing device. The rib 211 of the mold component 202 is inserted into the hole 209a of the circuit board 203 and the rib 212 is inserted into the hole 209b so that the position of the circuit board 203 of the pre-exposing device in a horizontal direction (up-to-down direction of FIG. 2C) may be fixed with respect to the mold component 202. In addition, at the base of the rib 211 and the base of the rib 212, a support portion 213 and a support portion 214 are provided, respectively. The support portion 213 and the support portion 214 are bearing surfaces raised higher than the surface of the mold component 202. When the circuit board 203 is pressed against the mold component 202, the circuit board 203 and the mold component 202 are brought into contact with each other via the support portion 213 and the support portion 214, that is, the circuit board 203 is fixed to the plurality of support portions of the mold component 202.

[Problem of Related Art in Assembling Circuit Board to Mold Component]

However, when the circuit board 203 of the related art illustrated in FIG. 2B is assembled to the mold component 202, the optical axis of the LED 204 of the circuit board 203 is slightly tilted with respect to the light guide 201 due to the presence of the electro conductive patterns 207. Of the two holes 209a and 209b, in proximity to the hole 209a through which the rib 211 passes, the electro conductive patterns 207a and 207c are provided, but no electro conductive pattern exists near the hole 209b through which the rib 212 passes. The electro conductive patterns 207 are copper foil formed on the base material of the circuit board 203. In a general FR-1 board, the thickness of copper foil for forming a copper foil layer is about 35 µm, and difference in height of about 35 µm is positively formed due to presence or absence of electro conductive patterns. As a result, the support portion 214 is in direct contact with the circuit board 203 while the support portion 213 is mounted on portions including the electro conductive patterns 207a and 207c of the circuit board 203, and hence the support portion 213 and the support portion 214 have the difference in height of about 35 µm. Consequently, the circuit board 203 is tiled with respect to the mold component 202.

For example, when a distance between the hole 209a through which the rib 211 passes and the hole 209b through which the rib 212 passes is 15 mm, and the difference in height is about 35 µm, the tilt angle of the circuit board 203 is about 0.13°. The light guide 201 illustrated in FIG. 2C is assumed to be, for example, a light guide 201 having a length of 350 mm for A3 printers. When the light from the LED 204 of the circuit board 203 enters the light guide 201 under a state in which the circuit board 203 is tilted with respect to the mold component 202 by about 0.13°, the shift amount of the optical axis at the farthest portion is 0.817 mm (=350 mm×35 µm/15 mm). The radius of the light guide 201 itself is about 2 mm, which means that the optical axis is shifted by about 41% (=0.817 mm/2 mm×100%) with respect to the radius of the light guide 201, as compared to a case where the circuit board 203 is not tilted.

[Structure of Circuit Board of First Embodiment]

Figure 3:
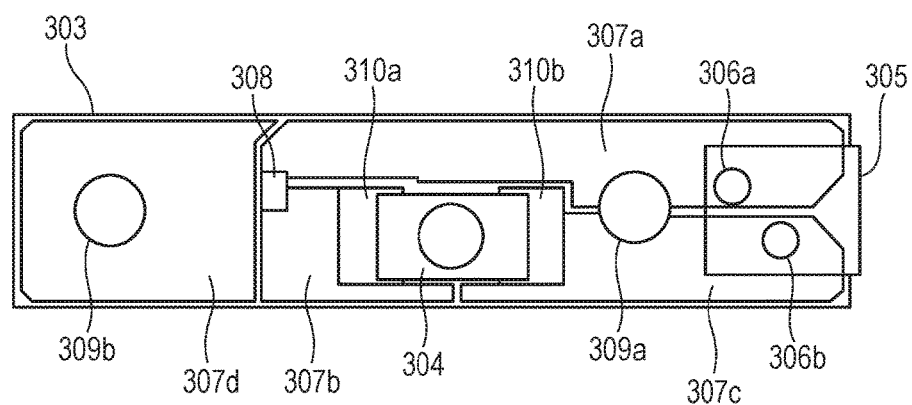
FIG. 3 is a view for illustrating a circuit board of the first embodiment.

FIG. 3 is a view for illustrating the structure of a circuit board 303 of the pre-exposing device of the first embodiment, and a view of the surface of the circuit board 303 on which an LED 304 is mounted when seen from the mold component 202 side. FIG. 3 is a view for illustrating the structure for which measures are taken to solve the problem described above, using the circuit board 203 of FIG. 2B as a base. In order to distinguish the structure of FIG. 3 from the structure of the circuit board 203 of FIG. 2B, the reference symbols of 200s in FIG. 2B are replaced with reference symbols of 300s. FIG. 3 differs from FIG. 2B in that the electro conductive patterns are changed to solid patterns.

Specifically, an electro conductive pattern 307a provided between a land 306a and a chip resistor 308, an electro conductive pattern 307b provided between the chip resistor 308 and a land 310a, and an electro conductive pattern 307c provided between a land 310b and a land 306b are solid patterns. In addition, an electro conductive pattern 307d being a solid pattern is arranged in the peripheral region of a hole 309b that is a non-conductive region on the circuit board 303. In order that the operation of the electric circuit may not be affected, the electro conductive patterns are formed so that the adjacent electro conductive patterns may be spaced apart (separated) from each other by a predetermined distance. In this way, the copper foil is arranged in most part of the circuit board 303, which includes the contact regions with the support portions 213 and 214. The electro conductive patterns 307a to 307d being the solid patterns are arranged, and hence when the circuit board 303 is assembled to the mold component 202, the support portion 213 and the support portion 214 are both brought into contact with the solid copper foil of the electro conductive patterns arranged on the circuit board 303. As a result, when the circuit board 303 is assembled to the mold component 202, the difference in height between the support portion 213 and the support portion 214, which is formed due to presence or absence of the copper foil in the related art, is not formed. Consequently, the circuit board 303 is not tilted with respect to the mold component 202.

In the related art of FIG. 2B described above, the support portion 213 is in contact with the copper foil layer forming the electro conductive patterns 207a and 207c on the circuit board 203, whereas the support portion 214 is in direct contact with the circuit board 203. As a result, the two support portions 213 and 214 are in contact with the circuit board 203 with different layer structures. In contrast to this, in the first embodiment, the support portion 213 is in contact with the copper foil layer forming the electro conductive patterns 307a and 307c on the circuit board 303, whereas the support portion 214 is in contact with the copper foil layer forming the electro conductive pattern 307d on the circuit board 303. As a result, the two support portions 213 and 214 are in contact with the circuit board 303 with the same layer structure.

Further, above the copper foil layer of the circuit board 303, for example, a green resist film being a protective film for the circuit board, which is called "resist" (hereinafter referred to as "resist"), is generally formed as an insulating film. A resist of the first embodiment is transparent or translucent. The copper foil solid patterns having metallic luster are arranged around the LED 304 being a light emitting element so that the luster can be provided through the resist. With this, the reflectance of light leaking from the LED 304 to the periphery of the LED 304 is improved, and consequently, brightness on the surface of the circuit board 303 is greatly improved and increased, as compared to a case where no copper foil solid pattern is arranged. The circuit boards 203 and 303 were actually photographed, and RGB values of a solid pattern portion on each image were compared to each other. The following results were obtained. The RGB values in the case of not using the solid patterns were 29, 54, and 26 for R, G, and B, respectively, whereas the RGB values in the case of arranging the solid patterns were 48, 119, and 52 for R, G, and B, respectively. The changes are converted into a change in brightness of from 38 to 79, which is about twice as large as 38. In this way, when the electro conductive patterns being the copper foil are provided as the solid patterns, and the solid pattern of the copper foil is also arranged in the non-conductive region, the light leaking from the LED 304 to the periphery can be reflected. The amount of light from the LED 304 in the optical axis direction can thus be increased.

In addition, the copper foil used as the electro conductive patterns has a feature of having better (higher) heat conductivity than the base material of the board. Thus, the solid pattern of the copper foil arranged around the LED 204 can enhance a heat dissipation effect for heat generated by the LED 204. A high luminance LED is used as the LED 204. High luminance LEDs have features of having large loss and being liable to generate heat while having high luminous intensity. LEDs have a feature that luminous intensity is lowered as a temperature increases. Hence, improvement of the heat dissipation effect also contributes to maintaining of high luminous intensity of the LED 204.

As described above, according to the first embodiment, the circuit board having the chip LED mounted thereon can be accurately assembled to the mold component, the reflectance of the light from the chip LED in the optical axis direction can be increased, and the heat dissipation effect of the chip LED can be enhanced.

A second embodiment of the present invention is described.

On circuit boards, symbols for indicating locations (mounting locations) of parts, a mark for indicating the cathode side of a diode, for example, or names, manufacturing numbers, and the like of the circuit boards, which workers can confirm with his/her eyes, are generally drawn by silk screen printing. However, as described above, slight steps on the circuit board leads to the tilt of the circuit board with respect to the mold component. Thus, the silk screen printing, which is performed above the resist layer, is preferably not performed because the silk screen printing may cause difference in height. Further, the silk screen printed portions have great unevenness in thickness unlike the copper foil and the resist, and it is not a good idea to provide the silk screen printed portions in a solid manner like the electro conductive patterns of the first embodiment. Accordingly, in the second embodiment, there is described a method of giving information to the workers that involves, instead of performing silk screen printing, cutting out the resist layer on the circuit board to form characters and symbols, thereby giving information.

[Structure of Circuit Board of Second Embodiment]

Figure 4:
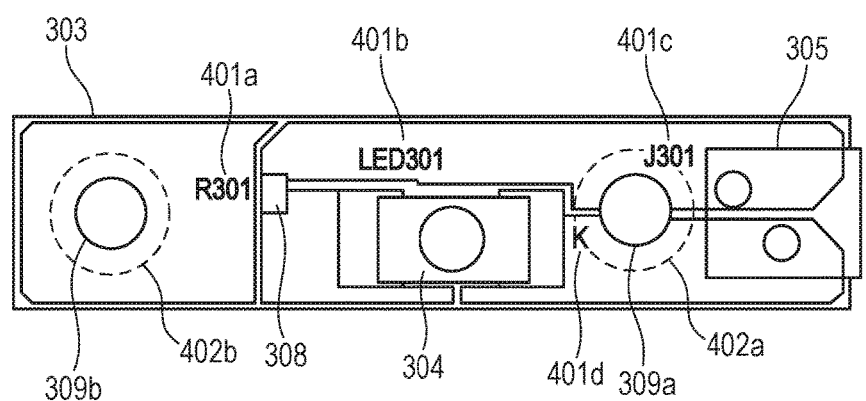
FIG. 4 is a view for illustrating a circuit board of the second embodiment.

FIG. 4 is an illustration of a circuit board 303 obtained by adding identification marks including location symbols 401a, 401b, and 401c and a cathode symbol 401d to the circuit board 303 of the first embodiment of FIG. 3. The location symbols 401a, 401b, and 401c, and the cathode symbol 401d are formed by cutting (removing) the shapes of the symbols out of the resist layer of the circuit board 303 so that the copper foil layer may be exposed. The location symbol 401a corresponds to "R301" indicating the chip resistor 308, and the location symbol 401b corresponds to "LED301" indicating the LED 304. Further, the location symbol 401c corresponds to "J301" indicating a connector 305, and the cathode symbol 401d corresponds to "K" indicating the position of the cathode terminal of the LED 304. Further, a broken circle 402a represents a region in which the support portion 213 being the base of the rib 211 is brought into contact with the circuit board 303 in FIG. 2C, and a broken circle 402a represents a region in which the support portion 214 being the base of the rib 212 is brought into contact with the circuit board 303.

In the second embodiment, an advantage provided by cutting out the resist layer to draw the symbols is improved visibility of formed symbols. Specifically, unlike FIG. 2B in which the electro conductive patterns being the solid copper foil are not provided, the copper foil portion of the circuit board 303 is exposed from the cutout portion of the resist layer, and chromatic contrast between the resist layer and the symbols is thus high. In addition, as represented by "J301" being the location symbol 401c and "K" being the cathode symbol 401d illustrated in FIG. 4, the sizes of the symbols formed by cutting out the resist layer are smaller than the area of the broken circle 402a in which the support portion 213 is brought into contact with the circuit board 303. In this way, when the sizes of the symbols formed by cutting out the resist layer are sufficiently smaller than the areas of the broken circles 402a and 402b in which the support portion 213 and the support portion 214 are brought into contact with the circuit board 303, the support portion 213 and the support portion 214 have no difference in height. Consequently, the circuit board 203 is not tilted. Thus, the location symbols and other symbols cause no trouble even when the symbols are formed, by cutting out the resist layer, on the contact surface with the support portion 213 and the support portion 214. Further, as circuit boards become smaller, it is more difficult to secure space, and the smallest size of characters that is capable of being drawn by silk screen printing is limited. Thus, also in terms of space, it is preferred to form the copper foil over the entire surface of the circuit board as the solid pattern, and draw the symbols by cutting out the resist layer so that the surface of the circuit board that is brought into contact with the support portions of the mold component can be effectively utilized, as in the second embodiment. In addition, a cost for silk screen printing in manufacturing boards can be eliminated.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2016-136820, filed Jul. 11, 2016, which is hereby incorporated by reference herein in its entirety.

What is claimed is:

1. A circuit board having a surface on which a light emitting element is mounted, wherein the surface of the circuit board comes into contact with a supporting member including a first support portion and a second support portion to be positioned with regard to the supporting member, the circuit board, comprising:
    a first electro conductive pattern configured to contact the first support portion of the supporting member on the surface of the circuit board, the first electro conductive pattern electrically connected with the light emitting element; and
    a second electro conductive pattern configured to contact the second support portion of the supporting member on the surface of the circuit board, the second electro conductive pattern not being electrically connected with the light emitting element,
    wherein the light emitting element is positioned between the first electro conductive pattern and the second electro conductive pattern.

2. A circuit board according to claim 1,
    wherein the supporting member includes a first protruding portion projected to a circuit board side farther than the first support portion and a second protruding portion projected to the circuit board side farther than the second support portion,
    wherein the circuit board has a first opening, which is formed near the first electro conductive pattern and through which the first protruding portion passes, and a second opening, which is formed near the second electro conductive pattern and through which the second protruding portion passes, and wherein the first protruding portion passes through the first opening and the second protruding portion passes through the second opening, respectively, so that the first electro conductive pattern contacts the first support portion and the second electro conductive pattern contacts the second support portion.

3. A circuit board according to claim 1, wherein each of the first electro conductive pattern and the second electro conductive pattern comprises a copper foil layer formed on a base material of the circuit board by copper foil.

4. A circuit board according to claim 3, further comprising a resist layer formed on the copper foil layer.

5. A circuit board according to claim 4, wherein the resist layer comprises one of a transparent resist layer and a translucent resist layer.

6. A circuit board according to claim 4, further comprising an identification mark drawn on the circuit board, which is formed by removing the resist layer along a shape of the identification mark so that the copper foil layer is exposed.

7. A circuit board according to claim 6, wherein the identification mark formed in a region in which a bearing surface is brought into contact with the circuit board has an area smaller than an area of the region.

8. A circuit board according to claim 3, wherein the copper foil layer comprises at least one solid pattern.

9. A circuit board according to claim 8, wherein adjacent solid patterns of the at least one solid pattern are arranged away from each other by a predetermined distance.

10. A circuit board according to claim 3, further comprising a solid pattern of the copper foil, which is arranged around the light emitting element of the circuit board.

11. A circuit board according to claim 1, wherein the light emitting element comprises a light emitting diode surface-mounted on the circuit board.

12. A circuit board according to claim 11, wherein the light emitting element has a directivity half value angle of ±15° or less.

13. A circuit board according to claim 1, wherein the light emitted from the light emitting element comes into a light guide provided on a side opposed to a side on which the light emitting element is provided with regard to an opening of the supporting member.

14. An image forming apparatus comprising:
a circuit board according to claim 1;
an image bearing member on which an image is formed; and
a supporting member configured to contact the circuit board to position the circuit board with regard to the supporting member,
wherein a light emitted from the light emitting element is emitted onto the image bearing member.

15. A circuit board having a first opening and a second opening, wherein the circuit board on which a light emitting element is mounted is supported by a supporting member having a first protruding portion and a second protruding portion, the circuit board comprising:

a first electro conductive pattern arranged around a circumference of the first opening; and
a second electro conductive pattern arranged around a circumference of the second opening,
wherein the first protruding portion passes through the first opening and the second protruding portion passes through the second opening, and the supporting member contacts the first electro conductive pattern and the supporting member contacts the second electro conductive pattern so as to fix the circuit board with regard to the supporting member.

16. A circuit board according to claim 15, wherein the first electro conductive pattern is connected to the light emitting element and the second electro conductive pattern is not connected to the light emitting element.

17. A circuit board according to claim 15, wherein the light emitting element is arranged between the first opening and the second opening.

18. A circuit board according to claim 15, wherein the supporting member comprises another opening, and
wherein in a condition where the supporting member contacts the first electro conductive pattern, the light emitting element is arranged at a portion where the light emitting element opposes to the another opening.

19. A circuit board according to claim 15, wherein each of the first electro conductive pattern and the second electro conductive pattern comprises a copper foil layer formed on a base material of the circuit board by copper foil.

20. A circuit board according to claim 19, further comprising a resist layer formed on the copper foil layer.

21. A circuit board according to claim 19, wherein the copper foil layer comprises at least one solid pattern.

22. A circuit board according to claim 21, wherein adjacent solid patterns of the at least one solid pattern are arranged away from each other by a predetermined distance.

23. A circuit board according to claim 19, further comprising a solid pattern of the copper foil, which is arranged around the light emitting element of the circuit board.

24. A circuit board according to claim 15, wherein the light emitting element comprises a light emitting diode surface-mounted on the circuit board.

25. A circuit board according to claim 15, wherein the light emitting element has a directivity half value angle of ±15° or less.

26. A circuit board according to claim 15, wherein the light emitted from the light emitting element comes into a light guide provided on a side opposed to a side on which the light emitting element is provided with regard to an opening of the supporting member.

27. An image forming apparatus comprising:
a circuit board according to claim 15;
an image bearing member on which an image is formed; and
a supporting member configured to contact the circuit board to position the circuit board with regard to the supporting member,
wherein a light emitted from the light emitting element is emitted onto the image bearing member.

* * * * *